United States Patent
Najafi et al.

(10) Patent No.: US 10,483,913 B2
(45) Date of Patent: Nov. 19, 2019

(54) LOW POWER CRYSTAL OSCILLATOR

(71) Applicant: QUALCOMM Incorporated, San Diego, CA (US)

(72) Inventors: Ali Najafi, Seattle, WA (US); Soheil Golara, Irvine, CA (US); Rabih Makarem, Irvine, CA (US); Shervin Moloudi, Los Angeles, CA (US)

(73) Assignee: QUALCOMM Incorporated, San Diego, CA (US)

( * ) Notice: Subject to any disclaimer, the term of this patent is extended or adjusted under 35 U.S.C. 154(b) by 238 days.

(21) Appl. No.: 15/649,475

(22) Filed: Jul. 13, 2017

(65) Prior Publication Data

US 2019/0020309 A1 Jan. 17, 2019

(51) Int. Cl.
*H03B 5/36* (2006.01)
*G04F 5/06* (2006.01)
*H03K 3/354* (2006.01)

(52) U.S. Cl.
CPC ..... *H03B 5/364* (2013.01); *H03B 2200/0012* (2013.01); *H03B 2200/0058* (2013.01); *H03B 2200/0062* (2013.01); *H03B 2200/0082* (2013.01)

(58) Field of Classification Search
CPC .............. H03B 5/364; H03B 5/362; H03B 2200/0082; H03B 2200/0058; H03B 2200/0012; H03B 2200/0062
USPC .......... 331/116 R, 116 M, 116 FE, 158, 182, 331/185, 186
See application file for complete search history.

(56) References Cited

U.S. PATENT DOCUMENTS

| | | | |
|---|---|---|---|
| 5,113,156 A | 5/1992 | Mahabadi et al. | |
| 6,016,081 A * | 1/2000 | O'Shaughnessy | H03K 3/03 327/172 |
| 7,292,114 B2 * | 11/2007 | Greenberg | H03B 5/364 331/116 FE |
| 7,355,489 B2 * | 4/2008 | Maheshwari | H03B 5/364 331/109 |
| 8,704,605 B1 | 4/2014 | Sinitsky et al. | |
| 9,209,747 B1 | 12/2015 | Sinha et al. | |
| 9,252,708 B1 | 2/2016 | Sinitsky et al. | |
| 9,350,294 B2 | 5/2016 | Calhoun et al. | |
| 9,431,959 B2 | 8/2016 | Liu et al. | |
| 2004/0000944 A1 | 1/2004 | Cho et al. | |
| 2010/0259335 A1 | 10/2010 | Martin | |
| 2011/0193641 A1 | 8/2011 | Clark et al. | |
| 2016/0065222 A1 * | 3/2016 | Okamoto | H03L 7/16 331/34 |

OTHER PUBLICATIONS

International Search Report and Written Opinion—PCT/US2018/039345—ISA/EPO—dated Oct. 17, 2018.

* cited by examiner

*Primary Examiner* — Richard Tan
(74) *Attorney, Agent, or Firm* — Haynes and Boone, LLP (36340)

(57) ABSTRACT

A Pierce oscillator is provided with a transconductance amplifier transistor having a DC drain voltage that is regulated to equal a reference voltage independently from a DC gate voltage for the transconductance amplifier transistor.

13 Claims, 5 Drawing Sheets

LOW POWER CRYSTAL OSCILLATOR

TECHNICAL FIELD

This application relates to oscillators, and more particularly to a crystal oscillator configured for low power operation and wide output amplitude swing.

BACKGROUND

To provide an accurate clock signal, it is conventional for an integrated circuit to include a crystal oscillator that uses a piezoelectric resonator. Due to their compact design, the great majority of crystal oscillators are Pierce oscillators such as an oscillator 100 of FIG. 1. A crystal or piezoelectric resonator 105 has a terminal driving a gate of an NMOS transconductance amplifier transistor Mn1 and another terminal connected to its drain. A load capacitor C2 connects between the drain of transistor Mn1 and ground. Similarly, another load capacitor C1 connects between the gate of transistor Mn1 and ground. A feedback resistor Rfb connects between the gate and drain of transistor M1, which has its drain biased by a bias current from a current source $I_B$.

An oscillation frequency $\omega$ for crystal 105 is typically specified by its manufacturer at a certain value for the load capacitance (sum of C1+C2). The gate of transistor Mn1 will then be biased at some direct current (DC) output voltage $V_0$ minus a factor of $V_1 \cos \omega t$, where V1 is the amplitude of the output voltage swing from the DC output voltage $V_0$. Given the negative gain from the gate of transistor Mn1 to its drain, the drain voltage then equals $V_0+V_1 \cos \omega t$. The output voltage swing depends upon the gain (transconductance) for transistor Mn1. In general, it is desirable for the output voltage swing to be as large as possible such that the drain voltage oscillates between ground and a power supply voltage VDD that powers current source $I_B$. To provide a maximum output swing, the $V_0$ voltage should thus equal to one-half of the power supply voltage VDD. But another concern is power consumption, which is reduced if transistor Mn1 is operated in the subthreshold region such that its gate-to-source voltage is less than its threshold voltage. An example DC gate voltage (which is also the $V_0$ voltage) for transistor Mn1 in subthreshold operation is 300 mV. It may thus be appreciated that maximizing output voltage swing while minimizing power consumption for amplifier 100 are at odds with each other due to the tie between the DC voltage for the gate and drain of transistor Mn1.

To decouple the DC drain and gate voltages for transistor Mn1, it is known to use a second transistor (not illustrated) such that the DC drain voltage for transistor Mn1 equals a sum of its DC gate voltage plus a gate-to-source voltage for the second transistor. The drain voltage may thus be pushed closer to the desired mid-rail level of VDD/2 while the DC gate voltage for transistor Mn1 is suitable for subthreshold operation. But the DC drain voltage then becomes dependent on the process, voltage, and temperature corner that sets the gate-to-source voltage for the second transistor. In addition, power consumption remains high. Accordingly, there is a need in the art for improved Pierce oscillators with reduced power consumption and high gain.

SUMMARY

The gain and output voltage swing for a Pierce oscillator are improved by decoupling the DC drain voltage and DC gate voltage for a first transistor. An operational amplifier sets the drain voltage for the first transistor at a desired level by biasing the first transistor's gate voltage through a negative feedback loop. A current source biases the first transistor with a bias current that in combination with a size for the first transistor ensures that the first transistor operates in the subthreshold region. The resulting Pierce oscillator thus enjoys the reduced power consumption and increased transconductance gain from a reduced DC gate voltage for the first transistor that ensures subthreshold operation without limiting the output voltage swing since the DC drain voltage is decoupled from the DC gate voltage. In particular, the operational amplifier may regulate the DC drain voltage at the desired level (e.g., one-half the power supply voltage for the Pierce oscillator) to maximize the output voltage swing.

The transconductance gain for the disclosed Pierce oscillator may be further enhanced through the inclusion of a second transistor in the current source. An oscillating input voltage from a crystal drives a gate of the second transistor and the gate of the first transistor such that both transistors contribute to the transconductance gain. These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A Pierce oscillator is provided in which the DC gate and drain voltages for a first transistor are decoupled through a decoupling capacitor. An operational amplifier regulates the DC drain voltage to equal a desired value set by a reference voltage. The DC drain voltage may thus be regulated to, for example, one-half the power supply voltage to maximize the output voltage swing. In contrast, the DC gate voltage is determined by a channel size for the first transistor and a bias current driven into the first transistor. In this fashion, the transconductance gain for the first transistor may be optimized by biasing the first transistor in the subthreshold region. The resulting high gain and DC drain voltage regulation maximizes the output voltage swing. For example, in some embodiments the output voltage swing may be full rail, i.e., from ground to the power supply voltage. Moreover, the subthreshold operation also minimizes power consumption by the first transistor.

Figure 1:
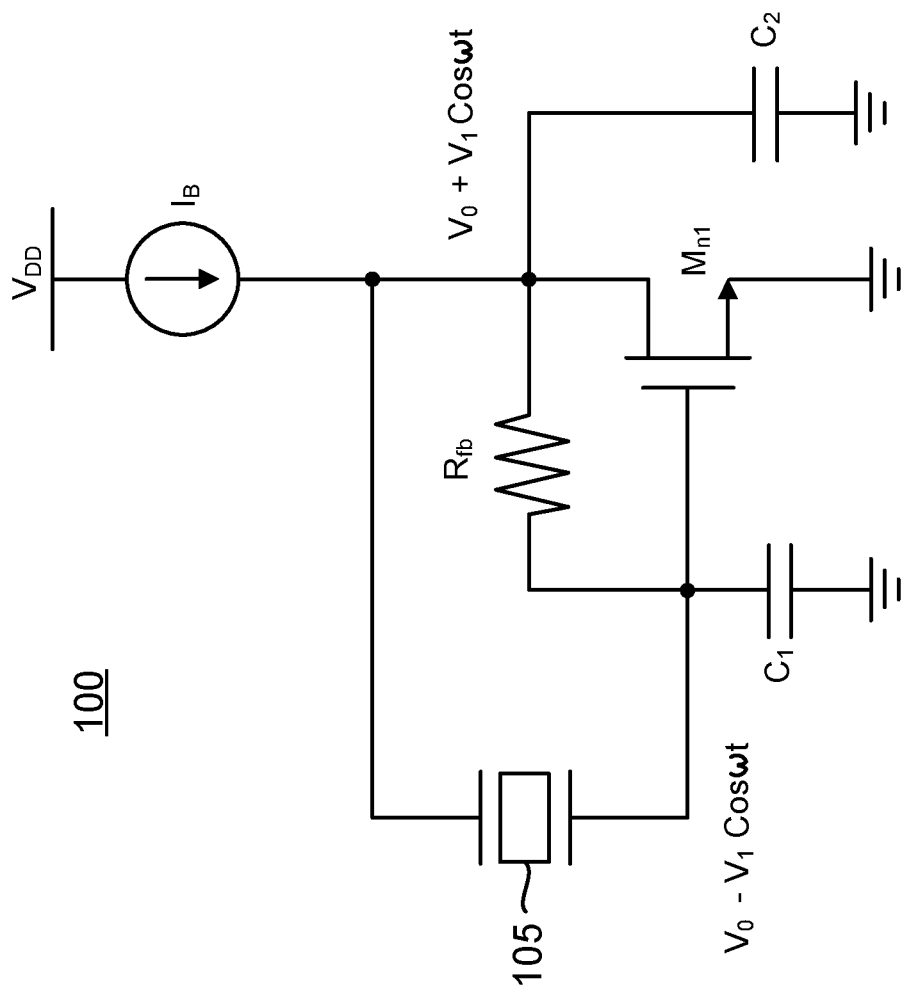
FIG. 1 is a circuit diagram of a conventional Pierce oscillator.
Figure 2:
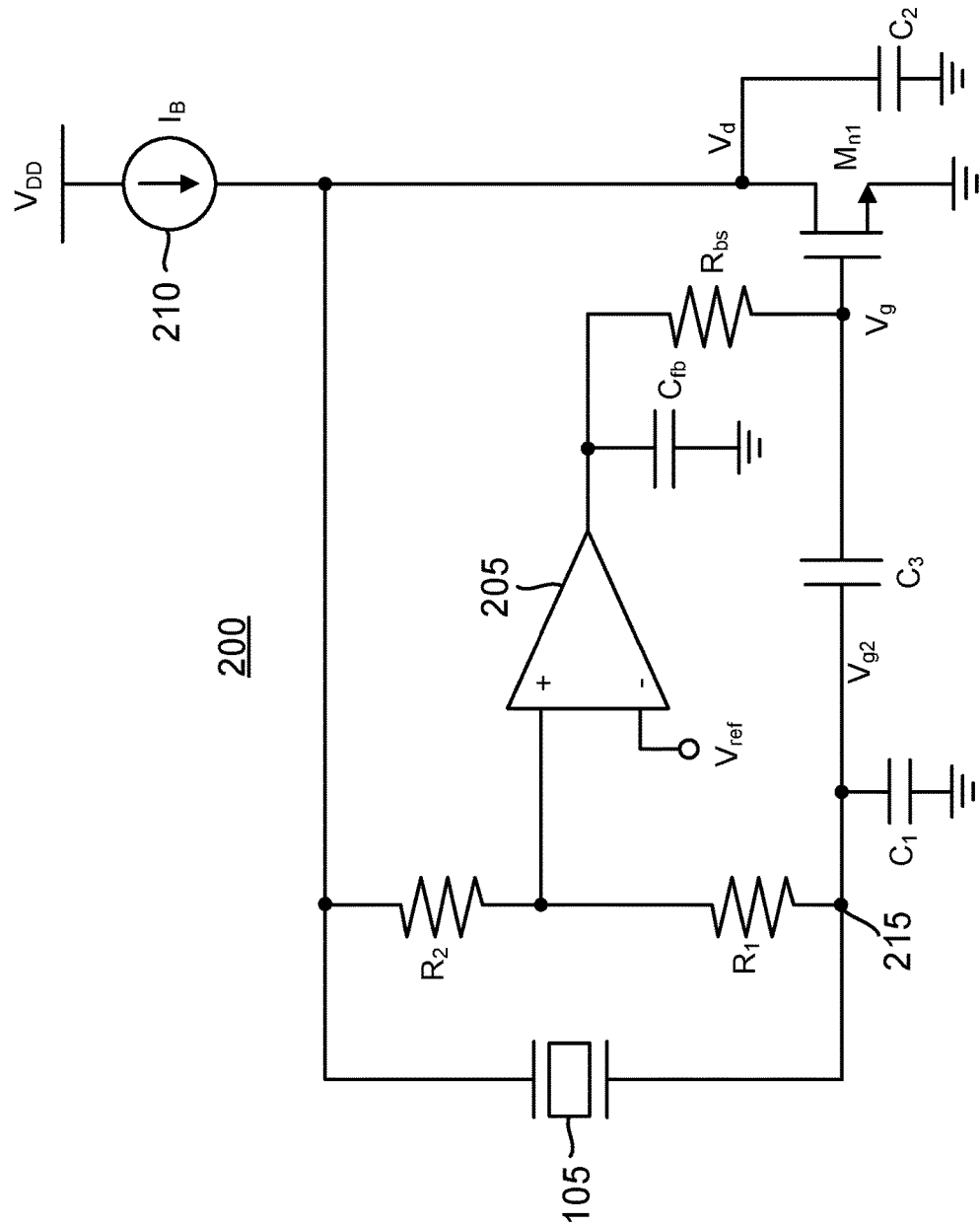
FIG. 2 is a circuit diagram for a low-power Pierce oscillator in which a feedback loop through an operational amplifier decouples the gain and drain voltages for a first transconductance amplifier transistor in accordance with an aspect of the disclosure.

An example Pierce oscillator 200 is shown in FIG. 2. Crystal 105, transistor Mn1, and load capacitors C1 and C2 are arranged as discussed with regard to FIG. 1. A resistor R2 connect between the drain for transistor Mn1 to a positive input terminal for an operational amplifier 205 that receives a reference voltage Vref at its negative input terminal. There is no DC current through resistor $R_2$ so there is no DC voltage across resistor $R_2$ such that the drain voltage Vd for transistor Mn1 is received at the positive input terminal for operational amplifier 205. Similarly, there is no DC current across a resistor $R_1$ that connects from the positive input terminal for operational amplifier 205 to a terminal 215 for a load capacitor C1. Operational amplifier 205 controls an AC gate voltage for transistor Mn1 through a bias resistor Rbs. The high gain feedback through operational amplifier 205 thus regulates a voltage for its positive input terminal to equal the reference voltage. Since there is no DC current through the voltage divider resistor $R_2$ during normal operation, both of its terminals are regulated to the reference voltage. Given that one of the terminals for resistor $R_2$ is tied to the drain of transistor Mn1, the drain voltage Vd for transistor Mn1 is thus regulated to equal the reference voltage.

Since there is also no DC current through resistor $R_1$, a voltage Vg2 for terminal 215 is regulated to equal the reference voltage. To prevent the reference voltage from biasing the DC gate voltage for transistor Mn1, a decoupling capacitor C3 connects the gate of transistor Mn1 to terminal 215. Decoupling capacitor C3 thus also isolates the DC drain voltage of transistor Mn1 from its DC gate voltage. To reduce noise from operational amplifier 205, its output terminal is loaded by a feedback capacitor $C_{fb}$ that connects to ground. The DC gate voltage for transistor Mn1 is set by the channel size for transistor Mn1 and a bias current $I_B$ from a current source 210 that drives the bias current into the drain terminal for transistor Mn1. Bias current $I_B$ and the channel size may thus be selected such that transistor Mn1 is biased for subthreshold operation. An AC portion for the gate voltage for transistor Mn1 is driven by an oscillating voltage from crystal 105 that couples through decoupling capacitor C3. It is this oscillating drive from crystal 105 that is subject to the transconductance gain for transistor Mn1. In one embodiment, operational amplifier 205 may be deemed to form a means for biasing the DC drain voltage of transistor Mn1 to equal the reference voltage.

Figure 3:
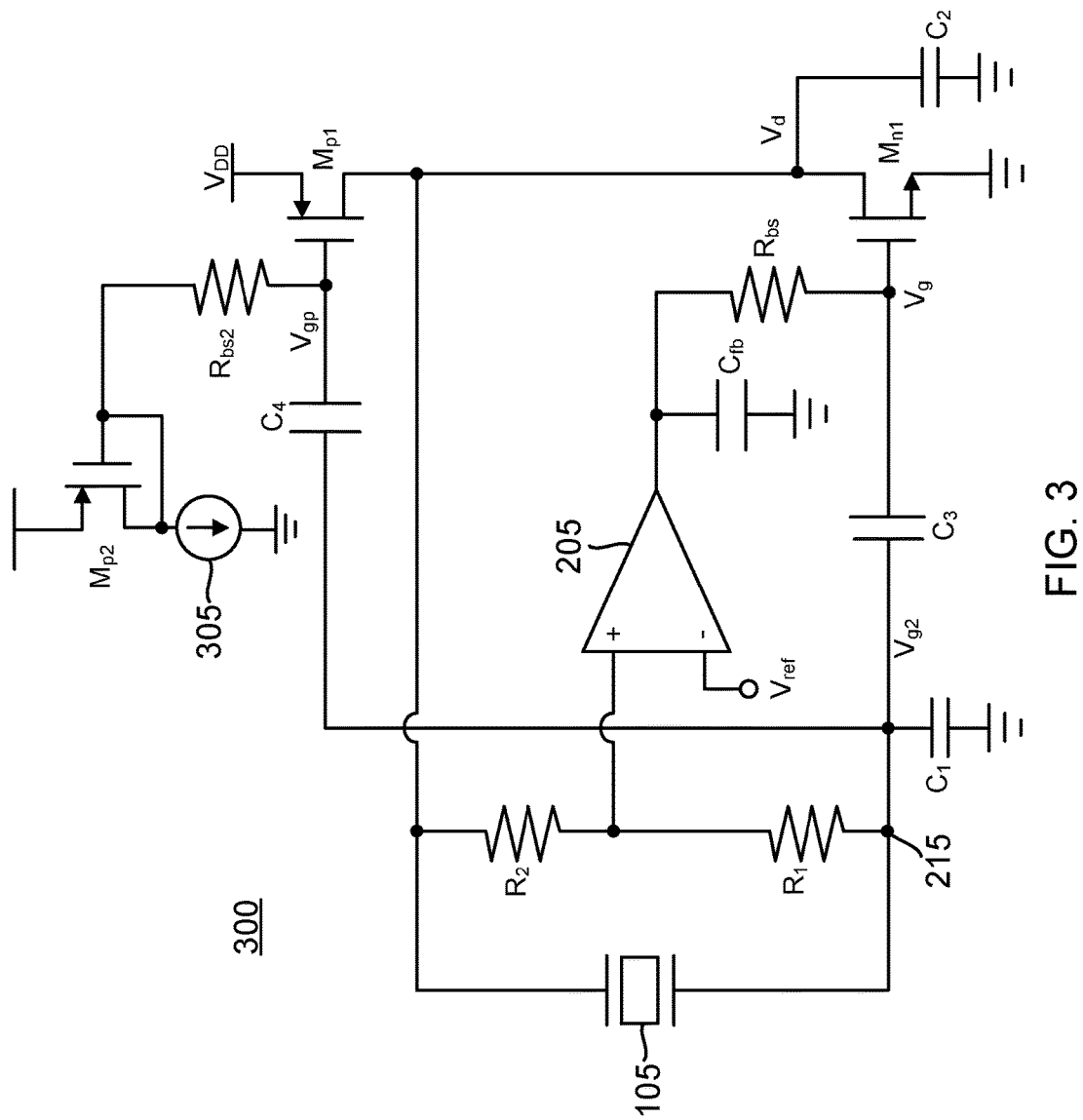
FIG. 3 is a circuit diagram for a modification of the Pierce oscillator of FIG. 2 to include a second transconductance amplifier transistor in accordance with an aspect of the disclosure.

As discussed earlier, the power consumption (current dissipated) through transistor Mn1 is minimized by its advantageous biasing in the subthreshold region yet the output voltage swing for the AC drain voltage is maximized by regulating the DC drain voltage to equal the reference voltage. Additional power reduction and gain enhancement may be achieved by modifying Pierce oscillator 200 to include a PMOS transistor Mp1 in its current source as shown for a Pierce oscillator 300 in FIG. 3. The source of transistor Mp1 connects to a power supply node supplying the power supply voltage VDD whereas its drain connects to the drain of transistor Mn1. Transistor Mp1 has its gate connected to a gate of a diode-connected PMOS transistor Mp2 through a resistor Rbs2. The source of diode-connected transistor Mp2 connects to the power supply node whereas its gate and drain are biased by a current source 305. Transistors Mp1 and Mp2 thus form a current mirror such that transistor Mp1 will conduct the same current as conducted by current source 305 (assuming that transistors Mp1 and Mp2 are matched). The voltage Vg2 at terminal 215 has the AC signal produced by the oscillation of crystal 105 that determines the transconductance gain for transistor Mn1. This AC signal will thus pass through a decoupling capacitor C4 that connects between terminal 215 and the gate of transistor Mp1. A gate voltage Vgp for transistor Mp1 will thus have the same AC signal applied to the gate of transistor Mn1 such that transistor Mp1 also contributes to the overall transconductance gain for Pierce oscillator 300. This increase in transconductance gain is quite advantageous at increasing the output voltage swing at the drains of transistors Mp1 and Mn1. It will be appreciated that transistors Mp1 and Mp2 may have their gates directly connected without the inclusion of resistor Rbs2 in alternative embodiments. But note that the impedance at the gate of transistor Mp2 is somewhat low due to its diode connection to its drain. Decoupling capacitor C4 would then need a larger capacitance to AC couple voltage Vg2 to the gate of transistor Mp1. Resistor Rbs2 thus advantageously increases the impedance at the gate of transistor Mp1 such that a smaller decoupling capacitor C4 may be used.

Not only does transistor Mp1 contribute to the transconductance gain, it acts in concert with transistor Mn1 to limit the current dissipation. For example, during the oscillation of the drain voltage Vd, this drain voltage may rise towards the power supply voltage VDD. Transistor Mp1 is then pushed into the deep triode region of operation. But the gate voltage for transistor Mn1 is then driven towards ground such that transistor Mn1 shuts off to limit current dissipation. A similar choking of the current dissipation occurs as the drain voltage Vd oscillates towards ground such that transistor Mp1 essentially shuts off Transistor Mp1 thus not only increases the transconductance gain but also limits the current consumption.

Figure 4:
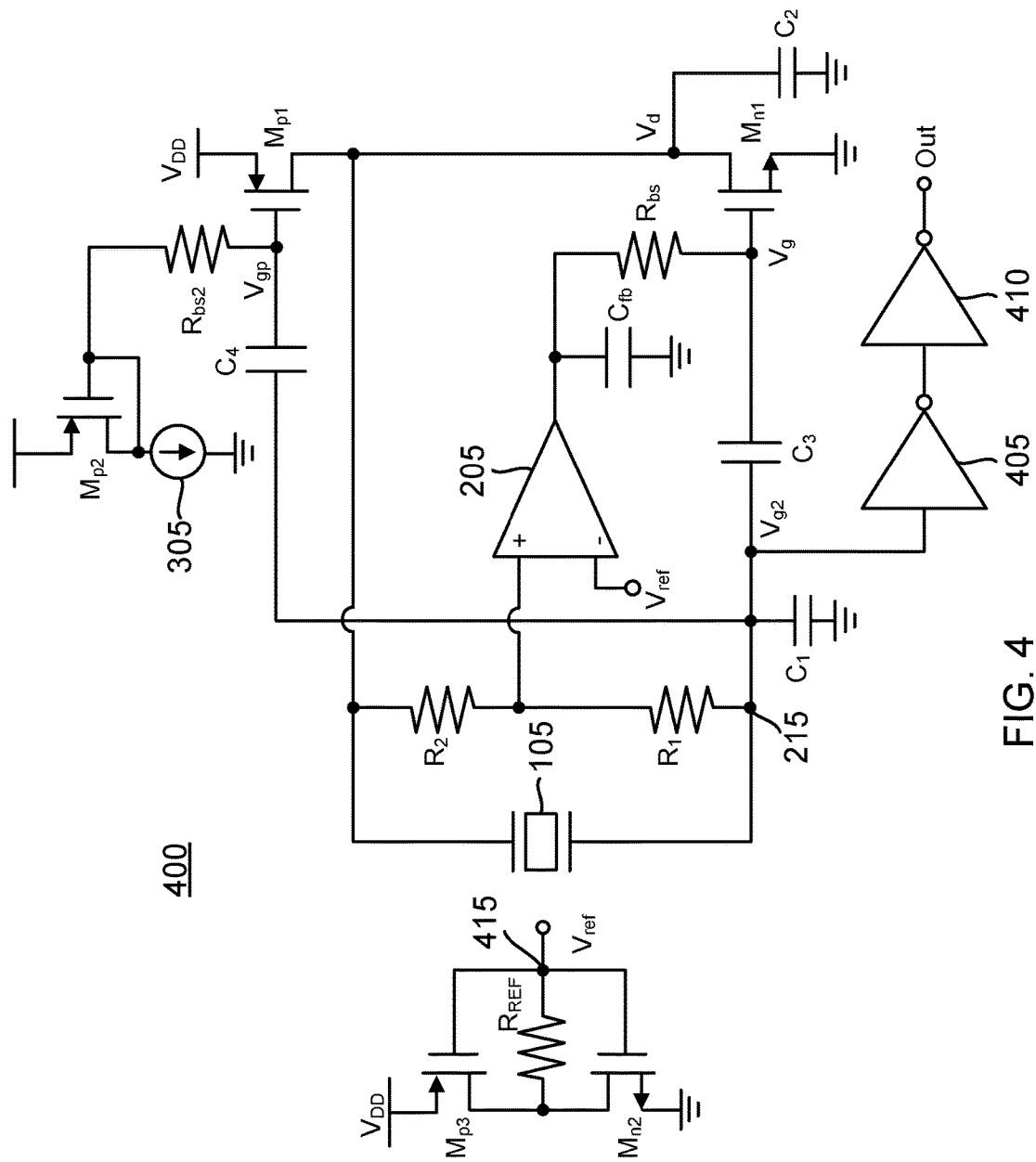
FIG. 4 illustrates a modification of the Pierce oscillator of FIG. 3 to reduce noise and ensure a 50/50 duty cycle in the output voltage in accordance with an aspect of the disclosure.

Pierce oscillator 300 may be further modified to reduce noise in the output voltage oscillation and improve its duty cycle as will be discussed with regard to a Pierce oscillator 400 shown in FIG. 4. Rather than use the drain voltage Vd as the output voltage, the output voltage is instead sourced from voltage Vg2 at terminal 215. As compared to the drain voltage Vd, voltage Vg2 has less noise due to the filtering through crystal 105. To produce the output voltage (Out), a first inverter 405 inverts voltage Vg2 to drive an input of a second inverter 410 that produces the output voltage. The output voltage will thus be a square wave that oscillates at the oscillation frequency set by crystal 105 and load capacitors C1 and C2.

To assure a 50/50 duty cycle for the oscillation of the output voltage, the reference voltage used by operational amplifier 205 may be generated by an inverter formed by a serial stack of a PMOS transistor Mp3 and an NMOS transistor Mn2. Inverters 405 and 410 would each be formed by an analogous serial stack (not illustrated) of a PMOS transistor and an NMOS transistor that would be matched to their counterpart transistors Mp3 and Mn2, respectively. The source of transistor Mp3 is tied to the power supply node for power supply voltage VDD whereas its drain is tied to the drain of transistor Mn2. The source of transistor Mn2 is connected to ground. A node 415 for supplying the reference voltage connects to the gates of transistors Mp3 and Mn2. In addition, node 415 connects to the drains for transistor Mp3 and Mn2 through a resistor Rref. At a power-up of the power supply voltage VDD, the reference voltage will initially be ground such that transistor Mp3 is initially on to charge its drain towards the power supply voltage VDD. This increase in the drain voltage feeds back through resistor Rref to partially switch on transistor Mn2 and partially switch off transistor Mp3. The result will be that the reference voltage will stabilize at the trip point (threshold voltage) for inverters 405 and 410. Ideally, this trip point is one-half the power supply voltage VDD but this depends upon the relative sizes of the inverters' NMOS and PMOS transistors as well as the process, voltage, and temperature corner. Advantageously, transistors Mp3 and Mn2 in combination with resistor Rref will track the trip point across all the process corners such that a 50/50 duty cycle for the output voltage oscillation will be maintained. All the components shown in FIGS. 2, 3, and 4 may be integrated within an integrated circuit such as a system-on-a-chip (SoC) with the exception of crystal 105. The resulting integrated circuit may then be integrated with crystal 105 in a semiconductor package. It will be appreciated, however, that load capacitors C0 and C1 may be more readily implemented as external devices due to their relatively large capacitances such that they would also not be integrated into the integrated circuit in some embodiments.

Figure 5:
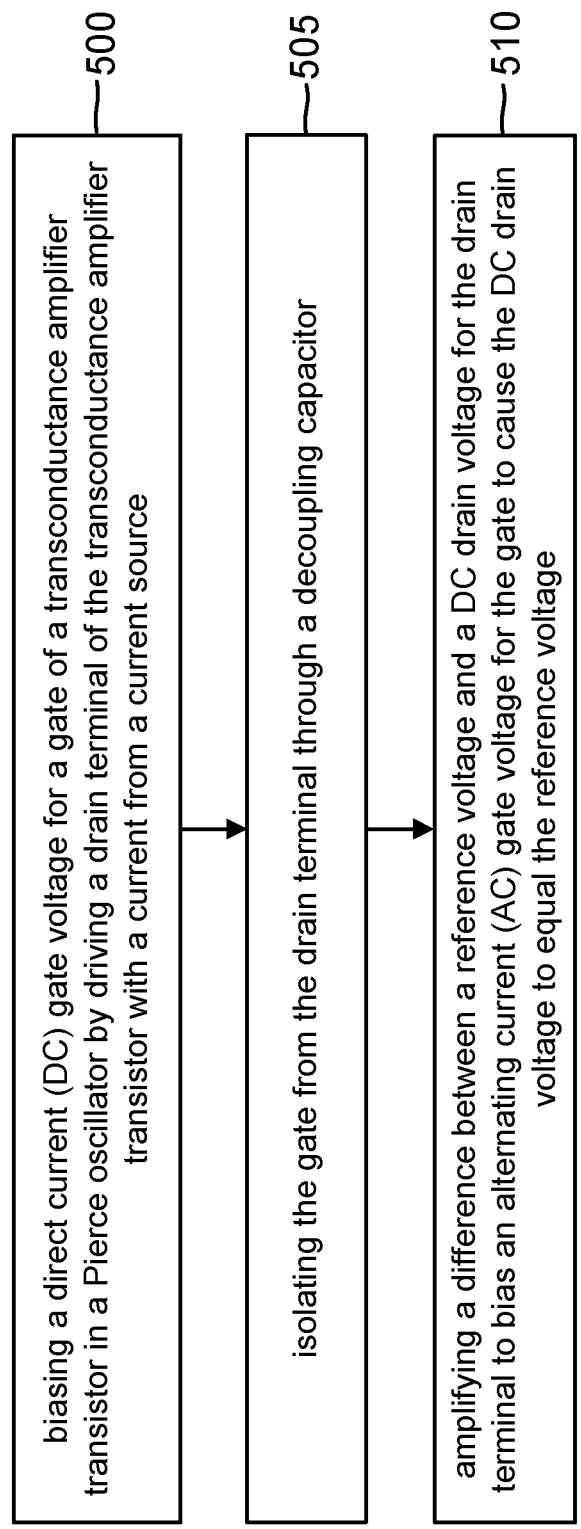
FIG. 5 is a flowchart for a method of operation of a Pierce oscillator in accordance with an aspect of the disclosure.

A method of operation for a Pierce oscillator will now be discussed with regard to the flowchart of FIG. 5. The method includes an act 500 of biasing a direct current (DC) gate voltage for a gate of a transconductance amplifier transistor in a Pierce oscillator by driving a drain terminal of the transconductance amplifier transistor with a current from a current source. The DC biasing of transistor Mn1 in oscillators 200, 300, and 400 responsive to the bias current is an example of act 500. The method further includes an act 505 of isolating the gate from the drain terminal through a decoupling capacitor. The function of decoupling capacitor C3 is an example of act 505. Finally, the method includes an act 510 of amplifying a difference between a reference voltage and a DC drain voltage for the drain terminal to bias an alternating current (AC) gate voltage for the gate to cause the DC drain voltage to equal the reference voltage. The biasing of the gate of transistor Mn1 by operational amplifier 205 is an example of act 510.

It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A circuit, comprising:
a first transistor;
a current source for driving a drain of the first transistor with a bias current;
a first decoupling capacitor for isolating a direct current (DC) drain voltage for the first transistor from a DC gate voltage for the first transistor, wherein a gate of the first transistor is configured to be biased by an AC input voltage from a crystal through the first decoupling capacitor;
a first inverter configured to invert a voltage at a terminal of the first decoupling capacitor;
a second inverter configured to invert an output signal from the first inverter to provide an output voltage for the circuit;
an operational amplifier configured to further bias the gate of the first transistor responsive to a comparison between the DC drain voltage and a reference voltage to regulate the DC drain voltage to equal the reference voltage; and
a reference inverter including a reference PMOS transistor having a source connected to a power supply node for supplying a power supply voltage, a reference NMOS transistor having a source connected to ground and having a drain connected to a drain of the reference PMOS transistor, and a reference resistor connected between the drain of the reference NMOS transistor and a reference node for supplying the reference voltage, wherein the reference node is connected to a gate of the reference PMOS transistor and to a gate of the reference NMOS transistor, and wherein the reference inverter is matched to the first inverter and to the second inverter.

2. The circuit of claim 1, further comprising:
a voltage divider having a first resistor having a first terminal connected to the drain of the first transistor and having a second terminal connected to a first terminal of a second resistor, wherein the operational amplifier has a first input connected to the second terminal of the first resistor and has a second input connected to reference voltage node for carrying the reference voltage.

3. The circuit of claim 2, wherein the first input is a positive input for the operational amplifier, and wherein the second input is a negative input for the operational amplifier.

4. The circuit of claim 2, further comprising a biasing resistor coupled between an output of the operational amplifier and the gate of the first transistor.

5. The circuit of claim 4, further comprising a feedback capacitor coupled between the output of the operational amplifier and the ground.

6. The circuit of claim 2, wherein a second terminal of the voltage divider is coupled to a terminal of the first decoupling capacitor.

7. The circuit of claim 6, wherein the first transistor is an NMOS transistor having a source connected to the ground, and wherein the current source comprises a PMOS current source transistor having a source connected to the power supply node for supplying the power supply voltage and a drain connected to the drain of the NMOS transistor.

8. The circuit of 7, further comprising a second decoupling capacitor coupled between the terminal of the first decoupling capacitor and a gate of the PMOS current source transistor.

9. The circuit of claim 7, further comprising:
a diode-connected PMOS transistor having a gate coupled to a gate of the PMOS current source transistor; and
a current source coupled between a drain of the diode-connected PMOS transistor and the ground.

10. The circuit of claim 9, further comprising a bias resistor configured to couple the gate of the diode-connected PMOS transistor to the gate of the PMOS current source transistor.

11. The circuit of claim 1, wherein the circuit is integrated within an integrated circuit in a circuit package, the circuit package further comprising the crystal having a first terminal connected to the drain of the first transistor and having a second terminal connected to the terminal of the first decoupling capacitor.

12. A method of oscillating an output signal, comprising:
biasing a direct current (DC) gate voltage of a gate of a first transistor in a Pierce oscillator by driving a drain of the first transistor with a current from a current source;
isolating the gate from the drain through a first decoupling capacitor;
generating a reference voltage using a reference inverter such that the reference voltage equals a threshold voltage of the reference inverter;

amplifying a difference between the reference voltage and a DC drain voltage for the drain to bias an alternating current (AC) gate voltage for the gate to cause the DC drain voltage to equal the reference voltage;

driving the gate of the first transistor with an oscillating voltage from a crystal through the first decoupling capacitor;

inverting the oscillating voltage in a first inverter to form an inverter output signal; and inverting the inverter output signal in a second inverter to form an oscillating output signal, wherein the reference inverter is matched to the first inverter and to the second inverter.

13. The method of claim 12, further comprising:

generating the current from the current source in a second transistor; and coupling the oscillating voltage from the crystal through a second decoupling capacitor to a gate of the second transistor.

\* \* \* \* \*